United States Patent
Shirata

[19]

[11] Patent Number: 6,002,487
[45] Date of Patent: Dec. 14, 1999

[54] ALIGNMENT METHOD FOR PERFORMING ALIGNMENT BETWEEN SHOT AREAS ON A WAFER

[75] Inventor: Yosuke Shirata, Tokyo, Japan

[73] Assignee: Nikon Corporation, Tokyo, Japan

[21] Appl. No.: 08/776,593

[22] PCT Filed: Jun. 20, 1996

[86] PCT No.: PCT/JP96/01715

§ 371 Date: Feb. 18, 1997

§ 102(e) Date: Feb. 18, 1997

[87] PCT Pub. No.: WO97/01184

PCT Pub. Date: Jan. 9, 1997

[30] Foreign Application Priority Data

Jun. 20, 1995 [JP] Japan .................................. 7-153145

[51] Int. Cl.$^6$ .......................... G01N 21/86; G03B 27/42
[52] U.S. Cl. .......................... 356/400; 356/401; 355/53; 355/55
[58] Field of Search .................... 356/400, 401; 355/53, 55

[56] References Cited

U.S. PATENT DOCUMENTS

| | | | |
|---|---|---|---|
| 4,650,983 | 3/1987 | Suwa ........................................ | 250/204 |
| 4,780,617 | 10/1988 | Umatate et al. ........................ | 250/548 |
| 5,117,255 | 5/1992 | Shiraishi et al. ........................ | 355/53 |
| 5,448,444 | 9/1995 | Iwamoto et al. ....................... | 355/53 |
| 5,493,402 | 2/1996 | Hirukawa ............................... | 356/401 |
| 5,525,808 | 6/1996 | Irie et al. ................................. | 356/400 |
| 5,543,921 | 8/1996 | Uzawa et al. ........................... | 356/401 |
| 5,561,606 | 10/1996 | Ota et al. ................................ | 364/489 |
| 5,596,204 | 1/1997 | Irie et al. . | |

FOREIGN PATENT DOCUMENTS

| | | |
|---|---|---|
| 59-6530 | 1/1984 | Japan . |
| 60-168112 | 8/1985 | Japan . |
| 61-44429 | 3/1986 | Japan . |
| 62-92315 | 4/1987 | Japan . |
| 5-47648 | 2/1993 | Japan . |
| 7-57991 | 3/1995 | Japan . |
| 7-191416 | 7/1995 | Japan . |

*Primary Examiner*—Frank G. Font
*Assistant Examiner*—Zandra Smith
*Attorney, Agent, or Firm*—Foley & Lardner

[57] ABSTRACT

The wafer marks of each shot area are measured by an alignment sensor, and the linear coordinate values of the reference point of each shot area are obtained on the basis of the measurement result and design data by EGA (steps 101 to 109). Curvelinear array coordinates which take the non-linear components of the shot array into consideration are obtained using an approximate expression on the basis of the linear coordinate values (step 110). Contour curves representing the contours of each shot area are calculated on the basis of the curvelinear array coordinates by interpolation (step 111). The exposure operation is performed while changing the reticle stage scanning direction, the rotation direction, and the level of the wafer stage in correspondence with the distortion of each shot area represented by the contour curves (step 114).

44 Claims, 5 Drawing Sheets

ALIGNMENT METHOD FOR PERFORMING ALIGNMENT BETWEEN SHOT AREAS ON A WAFER

TECHNICAL FIELD

The present invention relates to an alignment method for performing alignment between each shot area on a wafer and a mask pattern on the basis of array coordinates predicted using, e.g., a statistical method, which can be applied not only to alignment in a stepper type exposure apparatus but particularly suitable for alignment between a mask pattern and each shot area on a wafer in a step and scan type exposure apparatus.

BACKGROUND ART

When a semiconductor device, a liquid crystal display device, or the like is to be manufactured by photolithography, a projection exposure apparatus (e.g., a stepper) which transfers, through a projection optical system, the pattern of a reticle as a mask on each shot area on a wafer (or a glass plate or the like) coated with a photoresist is used. In addition to a stepper type projection exposure apparatus, a step and scan type projection exposure apparatus which synchronously scans the reticle and the wafer with respect to the projection optical system to increase the exposure area without increasing the load on the projection optical system is recently becoming popular.

For example, a semiconductor device is formed by overlaying multiple layers of circuit patterns on a wafer. When the circuit patterns of the second and subsequent layers are to be projected and exposed on the wafer, alignment between each shot area on the wafer, on which a circuit pattern has already been formed, and a reticle pattern to be exposed next, i.e., wafer alignment must be accurately performed. As a highly accurate wafer alignment method for the conventional projection apparatus, an alignment method called enhanced global alignment (to be abbreviated as "EGA" hereinafter) disclosed in, e.g., Japanese Patent Laid-Open No. 61-44429 is known, in which the coordinate positions of alignment marks (wafer marks) provided to a predetermined number of selected shot areas (sample shots) on a wafer are measured, and the measurement result is subjected to statistical processing to calculate the array coordinates of each shot area on the wafer.

DISCLOSURE OF INVENTION

In the alignment method by EGA, however, the array coordinates of the shot area on the wafer are linearly calculated, and alignment is performed on the basis of the array coordinates. Nonlinear distortion in the shot area or nonlinear distortion of the wafer itself, which is caused by various wafer processes, remains as an alignment error (overlay error). For this reason, when the nonlinear distortion is particularly large, accurate alignment can hardly be performed.

The present invention has been made in consideration of the above situation, and has as its object to provide an alignment method which enables accurate alignment between each shot area and the exposure pattern of a reticle even when the shot area on a wafer, or the wafer itself has nonlinear distortion.

According to the present invention, there is provided an alignment method for performing alignment between each shot area on a substrate (W) and a pattern of a mask (R) in an exposure apparatus which transfers the pattern formed on the mask (R) onto the shot area on the substrate (W), comprising the first process (steps 101 to 107) of measuring array coordinates of predetermined reference points (22a to 22h) of a plurality of predetermined shot areas (21a to 21h) of all shot areas on the substrate (W), respectively, the second process (steps 108 and 109) of performing statistical processing of actual measurement array coordinates measured in the first process and designed array coordinates of the predetermined reference points (22a to 22h) of the plurality of predetermined shot areas (21a to 21h) on the substrate (W), thereby calculating a linear component of the actual measurement array coordinates of the predetermined reference points, the third process (step 110) of subtracting the linear component from the actual measurement array coordinates to obtain a nonlinear component, and the fourth process (step 111) of obtaining distortions of the shot areas (21a to 21h) on the substrate on the basis of the nonlinear component obtained in the third process.

In this case, a projected image of the pattern of the mask on the substrate (W) is preferably distorted in correspondence with the distortions of the shot areas (21a to 21h), which are detected in the fourth process.

The fourth process preferably includes the processes of approximating a plurality of curves which pass the predetermined reference points (22a to 22h) on the basis of the actual measurement array coordinates which are measured in the first process, and obtaining contours of the shot areas (21a to 21h) on the substrate (W) on the basis of the plurality of curves obtained by approximation.

An example of the exposure apparatus is a scan exposure type exposure apparatus which scans the mask (R) relative to the substrate (W) to sequentially transfer the pattern of the mask (R) on each shot area (21d) on the substrate. In this case, preferably, at least one of a relative scanning direction, a misalignment along a scanning direction, and a level of the substrate (W) is changed during a relative scanning operation of the mask (R) and the substrate (W) to distort the projected image of the pattern of the mask (R) on the substrate.

According to the alignment method of the present invention, by obtaining the nonlinear components of the array coordinates of the predetermined reference points of the predetermined shot areas, the nonlinear distortion of the substrate (W), which cannot be detected in the prior art, can be detected.

When the projected image of the pattern of the mask on the substrate (W) is to be distorted in correspondence with the distortions of the shot areas (21a to 21h), which are detected in the fourth process, a nonlinear error can also be corrected. Therefore, more accurate alignment is enabled.

When, in the fourth process, the plurality of curves which pass predetermined reference points (22a to 22h) are to be approximated on the basis of the actual measurement array coordinates measured in the first process, and the contours of the shot areas (21a to 21h) on the substrate (W) are to be calculated on the basis of the plurality of curves obtained by the approximation, contours almost corresponding to the actual shapes can be obtained even when the shot areas (21a to 21h) have nonlinear distortions.

Assume that the exposure apparatus is a scan exposure type exposure apparatus which scans the mask (R) relative to the substrate (W) to sequentially transfer the pattern of the mask (R) onto each shot area on the substrate (W). When at least one of the relative scanning direction, the misalignment along the scanning direction, and the level of the substrate (W) is to be changed during the relative scanning operation of the mask (R) and substrate (W) to distort the projected image of the pattern of the mask (R) on the substrate, the relative scanning direction, the misalignment along the scanning direction, or the level of the substrate (W) is changed in correspondence with the distortion of the shot area while scanning the shot area, thereby overlaying the projected image of the pattern on the substrate on the distorted shot area.

Figure 1:
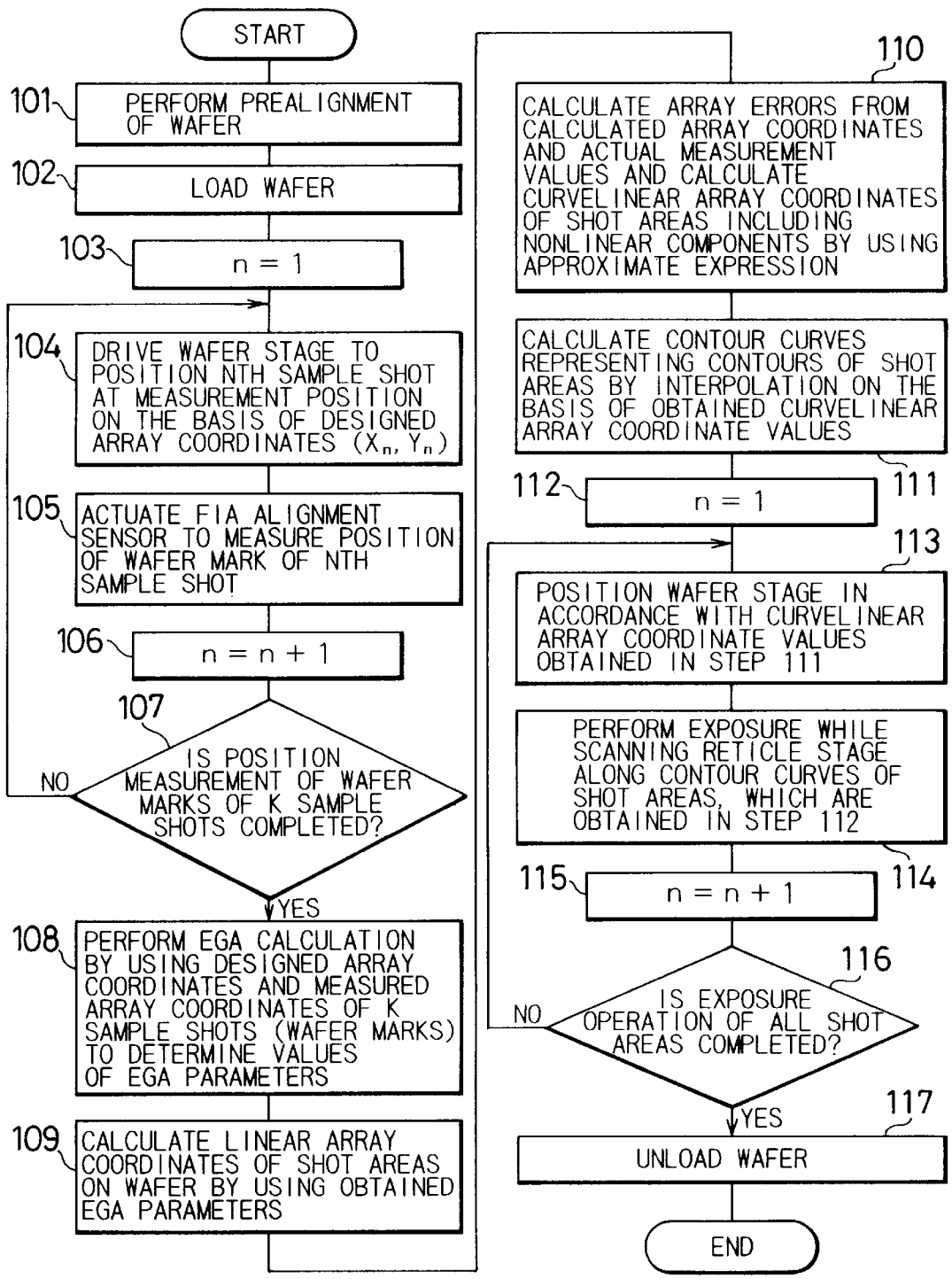
FIG. 1 is a flow chart showing an alignment method according to an embodiment of the present invention.

Reference numerals and symbols in the drawings are as follows.

R reticle
W wafer
3 reticle stage
5 projection optical system
7 wafer stage
7X X-stage
7Y Y-stage
7Z Z-stage
9 laser interferometer (for reticle)
15 laser interferometer (for wafer)
11 FIA alignment sensor
12 stage control system
13 central control system
14 alignment control system
21a–21h shot area
22a–22h central point
48A, 48B, 49A, 49B wafer mark
23 array curve
24T, 24B, 24R, 24L contour curve

BEST MODE OF CARRYING OUT THE INVENTION

A projection exposure apparatus according to an embodiment of the present invention will be described below with reference to the accompanying drawings. In this embodiment, the present invention is applied to a scan exposure type (e.g., step and scan type) projection exposure apparatus.

Figure 2:
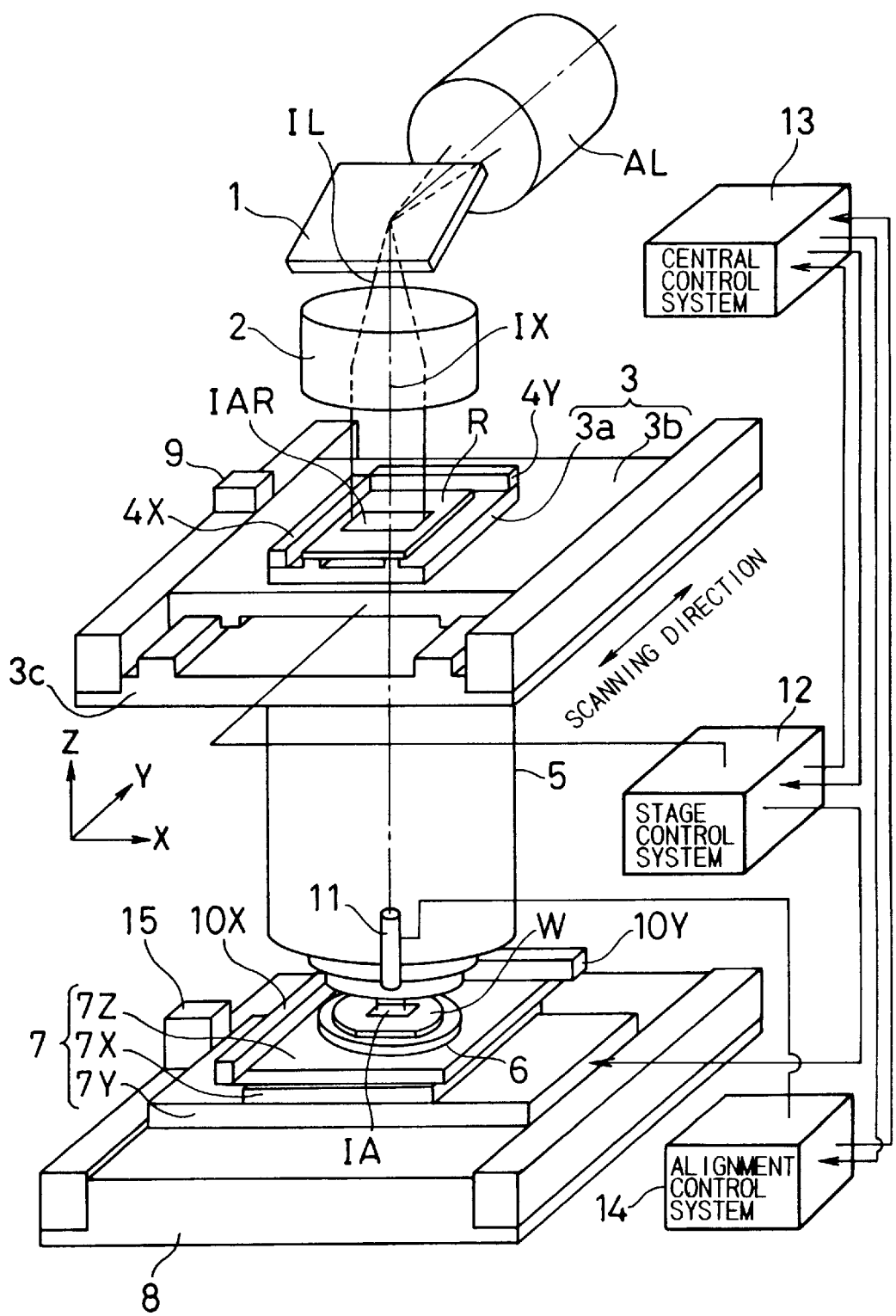
FIG. 2 is a perspective view schematically showing the overall arrangement of a projection exposure apparatus used in the embodiment of the present invention.

FIG. 2 is a perspective view schematically showing the arrangement of the projection exposure apparatus of this embodiment. Referring to FIG. 2, illumination light IL emitted from an exposure light source such as an ultrahigh-voltage mercury lamp passes through an optical system AL which comprises a fly-eye integrator, a collimator lens, a relay lens, a field stop, and the like, so that a uniform illuminance distribution is obtained. The illumination light IL having the uniform illuminance distribution is reflected by a dichroic mirror 1 and illuminates, through a condenser lens 2, a slit-like illumination area IAR on the lower surface (pattern formation surface) of a reticle R on which a circuit pattern or the like is drawn. The pattern in the illumination area IAR is reduced through a projection optical system 5 at a reduction magnification β (e.g., 1/5 or 1/4), and the projection image is projected on a slit-like exposure area IA on a wafer W with its surface coated with a photoresist (photosensitive material). In FIG. 2, the Z-axis is set to be parallel to an optical axis IX of a projection optical system PL, and the X- and Y-axes are set on an orthogonal coordinate system in a plane perpendicular to the optical axis IX. As the exposure light source, in addition to a line lamp such as an ultrahigh-voltage mercury lamp, an excimer laser source such as a KrF excimer laser or an ArF excimer laser, or an RF generation unit such as a copper vapor laser or a YAG laser is used.

The reticle R is vacuum-chucked on a reticle fine adjusting stage 3a. The reticle fine adjusting stage 3a finely and two-dimensionally moves (and also rotates) in a plane (X-Y plane) perpendicular to the optical axis IX, thereby positioning the reticle R. The reticle fine adjusting stage 3a is mounted on a reticle scanning stage 3b which is driven in the scanning direction by a reticle driving unit (not shown) constituted by, e.g., a linear motor, so that the reticle fine adjusting stage 3a can move in the Y direction (scanning direction) at a predetermined scan rate. A reticle stage 3 is constituted by the reticle fine adjusting stage 3a and the reticle scanning stage 3b and has a moving stroke such that the entire surface of the reticle R traverses at least the optical axis IX of the illumination optical system along the Y direction on a reticle base 3c. An X-direction movable mirror 4X for reflecting a laser beam from an external X-direction laser interferometer 9, and a Y-direction movable mirror 4Y for reflecting laser beams from two Y-direction laser interferometers (not shown) are fixed at the end portions of the reticle fine adjusting stage 3a. The positions of the reticle stage 3 along the scanning direction (Y direction) and X direction are always detected as the average value of measurement values of the two laser interferometers and a measurement value of the X-direction laser interferometer, respectively, at a resolving power of, e.g., about 0.01 μm. In addition, the rotation angle of the reticle stage 3 is detected on the basis of the difference between the measurement values of the two Y-axis laser interferometers.

The position and rotation information of the reticle stage 3 from these laser interferometers are sent to a stage control system 12. The stage control system 12 drives the reticle stage 3 through the reticle driving unit (not shown) on the basis of the position and rotation information of the reticle stage 3. The initial position of the reticle stage 3 is determined such that the reticle R is accurately positioned at a predetermined reference position by a reticle alignment system (not shown). For this reason, the position of the reticle R can be sufficiently precisely measured only by measuring the positions of the movable mirrors 4X and 4Y by the laser interferometers. The measurement values of the laser interferometers are supplied to an alignment control system 14 and a central control system 13 through the stage control system 12. The central control system controls the stage control system 12 on the basis of the measurement values of the laser interferometers.

In the projection exposure apparatus of this embodiment, the rectangular (slit-like) illumination area IAR of the reticle R, whose longitudinal direction is perpendicular to the scanning direction (Y direction) of the reticle R, is illuminated, and the reticle R is scanned in the −Y direction (or in the +Y direction) at a rate $V_R$ in the exposure operation, as shown in FIG. 2. The pattern in the illumination area IAR (the center of the illumination area IAR almost matches the optical axis IX) is projected onto the wafer W through the projection optical system 5 to form the slit-like exposure area IA.

Since the wafer W has an erected imaging relationship with respect to the reticle R, the wafer W is scanned in the +Y direction (or in the −Y direction) in synchronism with the reticle R at a rate $V_W$, so that the pattern of the reticle R is sequentially exposed on the entire surface of each shot area on the wafer W. The ratio of the scan rates ($V_W/V_R$) corresponds to the reduction magnification β of the projection optical system PL, and the pattern of the reticle R is properly reduced and transferred onto the shot area on the wafer W.

The wafer W is vacuum-chucked on a wafer holder 6. The wafer holder 6 is held on a wafer stage 7. The wafer stage 7 can be tilted in an arbitrary direction in accordance with the best imaging plane of the projection optical system PL and also finely moved along the optical axis IX (Z direction) by a driving unit (not shown). The wafer stage 7 is constituted by a Z-stage 7Z rotatable about the optical axis IX, an X-stage 7X having the Z-stage 7Z mounted thereon and movable in the X direction, and a Y-stage 7Y having the X-stage mounted thereon and movable in the Y direction. The wafer stage 7 performs a step and scan operation in which an operation of performing scan exposure on each shot area on the wafer W by the wafer stage driving unit (not shown) such as a motor and an operation of moving the wafer stage to the exposure start position of the next shot area are repeatedly performed.

An X-direction movable mirror 10X for reflecting a laser beam from an external X-direction laser interferometer 15 and a Y-direction movable mirror 10Y for reflecting laser beams from two Y-direction laser interferometers (not shown) are fixed at the end portions of the Z-stage 7Z of the wafer stage 7. The position of the wafer stage 7 in the X-Y plane is always detected by the laser interferometer 15 and the Y-direction laser interferometers (these laser interferometers will be represented by the "laser interferometer 15" hereinafter) at a resolving power of, e.g., about 0.01 μm. A coordinate system defined by the X- and Y-coordinates of the wafer stage 7 measured by the laser interferometer 15 is referred to as a stage coordinate system (X,Y). The rotation angle of the wafer stage 7 is also always detected. The position information (or speed information) and rotation information of the wafer stage 7 are sent to the stage control system 12. The stage control system 12 controls the stage driving unit on the basis of this position information (or speed information). The measurement value of the laser interferometer 15 is supplied to the alignment control system 14 and the central control system 13 through the stage control system 12. The central control system 13 controls the stage control system 12 on the basis of the measurement value of the laser interferometer 15.

A wafer position detection system (focal position detection system) of an oblique incidence type constituted by an irradiation optical system for irradiating an imaging light beam for forming a pinhole image or slit image on the exposure surface of the wafer W in an oblique direction with respect to the optical axis IX, and a light-receiving optical system for receiving, through the slit, the imaging light beam reflected by the exposure surface of the wafer W is fixed to a support unit (not shown) for supporting the projection optical system 5. The arrangement of this wafer position detection system is disclosed in detail in, e.g., Japanese Patent Laid-Open No. 60-168112. The wafer position detection system is used to detect any Z-direction positional deviation of the exposure surface of the wafer with respect to the best imaging plane of the projection optical system 5 and drive the wafer holder 6 in the Z direction such that the wafer W and the projection optical system 5 maintain a predetermined distance therebetween. Wafer position information from the wafer position detection system is sent to the central control system 13 through the stage control system 12. The central control system 13 drives the wafer holder 6 in the Z direction on the basis of the wafer position information.

An alignment sensor 11 based on the off-axis FIA (Field Image Alignment) method (image sensing method), which performs alignment between the reticle R and the wafer W, is arranged near the projection optical system 5 of the projection exposure apparatus of this embodiment. A measurement light beam from the FIA alignment sensor 11 is irradiated on a wafer mark (to be described later) on the wafer W. The light beam reflected by the wafer mark is formed into a wafer mark image on an index plate provided in the alignment sensor 11. This image is relayed and sensed by an image sensing device such as a two-dimensional CCD. When the sensing signal is subjected to image processing by the alignment control system 14, the position of the wafer mark with respect to a reference, i.e., an index mark on the index plate is detected. The coordinate values of the wafer stage 7 at that time are added, the coordinate values of the wafer mark on the stage coordinate system (X,Y) are detected.

Although not illustrated, the projection exposure apparatus of this embodiment also has LSA (Laser Step Alignment) and LIA (Laser Interferometric Alignment) alignment sensors. The type of alignment sensor is selected on the basis of the surface state of the wafer W. A detection signal from the alignment sensor is processed by the alignment control system 14. The alignment control system 14 is integrally controlled by the central control system 13. Each alignment sensor comprises a total of two alignment sensor units, i.e., an alignment sensor unit for detecting the X-direction misalignment and an alignment sensor unit for detecting the Y-direction misalignment on the basis of the wafer mark (to be described later).

The alignment method of this embodiment will be described below with reference to the flow chart of FIG. 1.

The wafer W is coarsely positioned at a loading point in step 101. More specifically, the wafer W is coarsely positioned by a prealignment unit (not shown) such that a flat or notched portion on the wafer W is directed in a predetermined direction. In step 102, the wafer W is loaded onto the wafer holder 6 on the stage, and the wafer W is vacuum-chucked on the wafer holder 6 while keeping the previously determined direction.

In step 103, the positions of wafer marks formed on the respective shot areas on the wafer W are measured using the alignment sensor 11 shown in FIG. 2, thereby performing accurate alignment. This alignment is performed for the second and subsequent layers of the wafer W, and the wafer marks have already been formed in units of shot areas on the wafer W.

Figure 3:
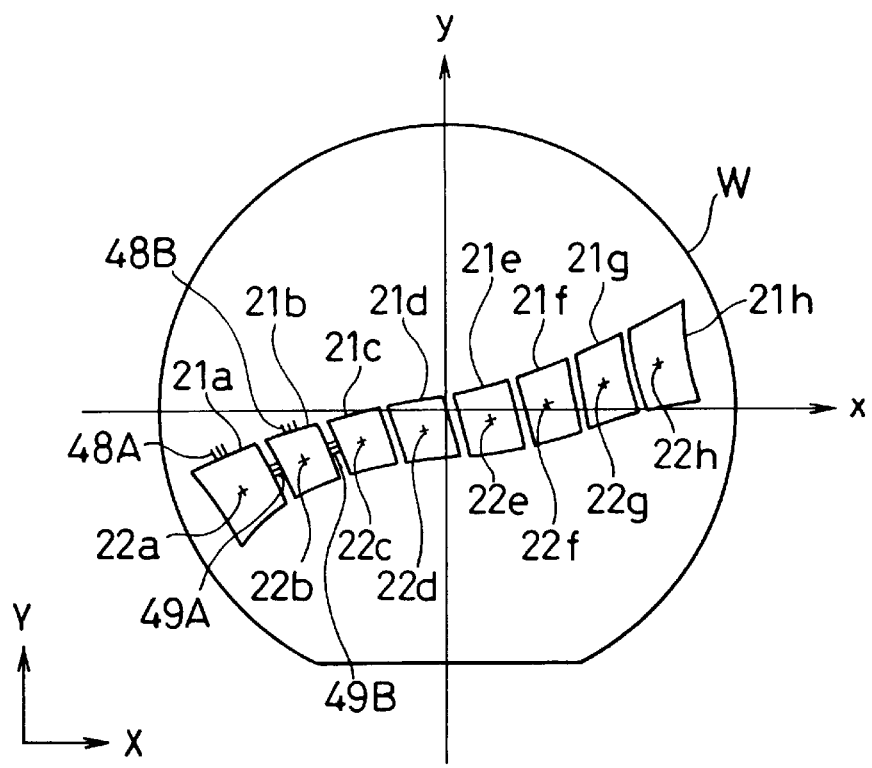
FIG. 3 is a plan view showing part of a shot array on a wafer W shown in FIG. 2 in reference to a sample coordinate system.

FIG. 3 is a view of a shot array on the wafer W, showing only one line at the central portion of the wafer W. The coordinate positions of the wafer marks of a predetermined number of shot areas (to be referred to as "sample shots" hereinafter) selected from all the shot areas on the wafer W are measured on the stage coordinate system (X,Y). In FIG. 3, shot areas 21a to 21h are defined as sample shots. Wafer marks 48A and 48B for X-direction position detection and wafer marks 49A and 49B for Y-direction position detection are formed in street lines between the shot areas, as shown for, e.g., the shot areas 21a and 21b. In the following description, the X- and Y-direction wafer marks respectively represent the central array coordinates of the center of each shot area, and the central array coordinates of the center are regarded as the array coordinates of each shot area. The designed array coordinates of each shot area on the wafer W on a coordinate system (sample coordinate system) (x,y) on the wafer W are stored in advance.

As shown in FIG. 3, the shot areas have deformed from the designed rectangular shape so central points 22a to 22h of the respective shot areas 21a to 21h are arrayed not to be parallel to the sample coordinate system (x,y) but to be curved. In this embodiment, linear approximation by EGA is performed for the shot array of the wafer W having such a shot array, and curvelinear approximation close to the measurement values is further performed, thereby calculating array coordinates almost corresponding to the actual shot array.

The shot area 21a is set as a sample shot as a measurement target. The X-coordinate of the X-axis wafer mark 48A on the stage coordinate system (X,Y) is detected by the alignment sensor 11 shown in FIG. 2. The Y-coordinate of the Y-axis wafer mark 49A is detected by the Y-axis alignment sensor (not shown). The detection results from these alignment sensors are supplied to the alignment control system 14 and the central control system 13.

More specifically, K (K is an integer of three or more) shot areas are selected from all shot areas on the wafer W as sample shots. The designed array coordinates of the centers of the all shot areas on the wafer W, i.e., the array coordinate values of the respective wafer marks on the sample coordinate system (x,y) are stored in the memory unit of the central control system 13. The designed array coordinates of the center of the nth (n=1 to K) sample shot will be represented by $(X_n, Y_n)$ hereinafter.

In step 103, the central control system 13 initializes the integer n representing the order of sample shots to 1. In step 104, the central control system 13 step-drives the wafer stage 7 through the stage control system 12 on the basis of the designed array coordinates $(X_n, Y_n)$ of the center of the nth sample shot, thereby setting the wafer marks of the nth sample shot at the measurement positions of the alignment sensor 11. In fact, the center of the sample shot deviates from the exposure position because of the expansion/contraction or rotation error of the wafer W. This misalignment amount becomes an alignment error, and actual array coordinates including this alignment error are measured.

In step 105, the central control system 13 actuates the two FIA alignment sensors and the alignment control system 14, thereby detecting the positions of the two wafer marks of the nth sample shot on the wafer W on the stage coordinate system (X,Y). The position information is supplied to the central control system 13.

In step 106, the value of the integer n is incremented by one. In step 107, it is determined whether measurement for the K sample shots is completed. Processes in steps 104 to 106 are repeated K times, so that the coordinate values of the two wafer marks of each of the K sample shots, i.e., array coordinates $(XM_n, YM_n)$ of the centers are measured and stored. When the measurement for the K sample shots is completed, the flow advances from step 107 to step 108.

The central control system 13 calculates coordinate transformation parameters (to be referred to as "EGA parameters" hereinafter) from the sample coordinate system (x,y) to the stage coordinate system (X,Y) by using the designed array coordinates $(X_n, Y_n)$ of the center of each sample shot and the actually measured array coordinates $(XM_n, YM_n)$. The EGA parameters may be calculated by an external computer. This calculation is performed using, e.g., the least square method, as disclosed in Japanese Patent Laid-Open No. 61-44429. The EGA parameters are linear parameters including linear expansion/contraction (scaling) values Rx and Ry, a rotation θ, an orthogonality W, and offset values Ox and Oy.

Figure 4:
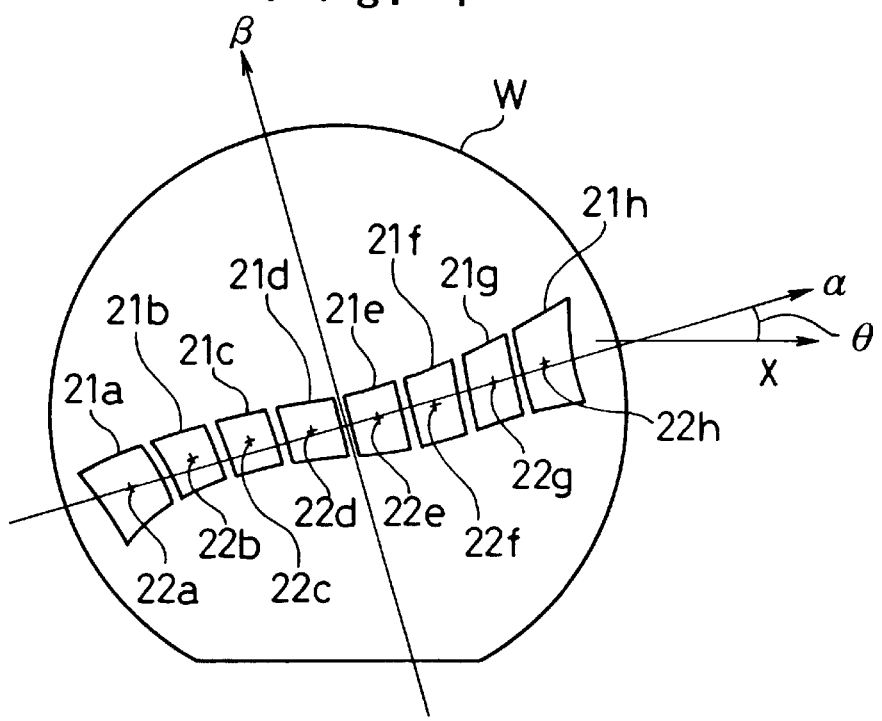
FIG. 4 is a plan view showing a deviation of the shot array shown in FIG. 3 from the linear component.
Figure 6:
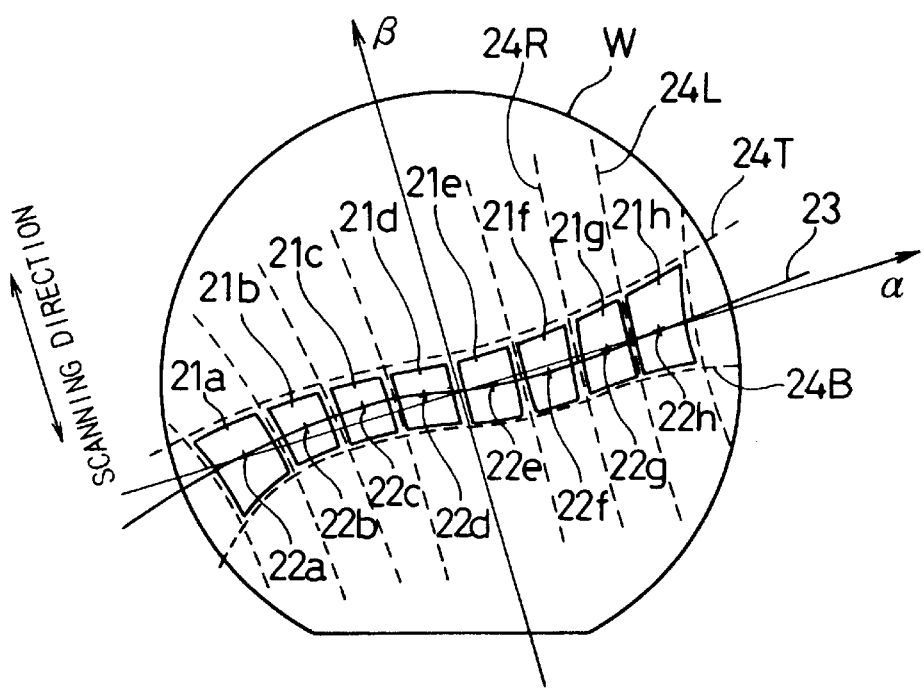
FIG. 6 is a plan view showing the contour curves of shot areas obtained on the basis of the array curve shown in FIG. 5.

In step 109, the central control system 13 calculates linear array coordinate values $(G_{Xn}, G_{Yn})$ of each central point on the stage coordinate system (X,Y) by using the EGA parameters obtained in step 108 and designed array coordinate values $(C_{Xn}, C_{Yn})$ of the central points of all the shot areas on the wafer W. FIG. 4 shows the states of the central points 22a to 22h of the shot areas 21a to 21h on the stage coordinate system shown in FIG. 3. In FIG. 6, the α-axis represents a straight line which connects the array coordinate values $(G_{Xn}, G_{Yn})$ obtained by the EGA calculation for the central points 22a to 22h, and the β-axis represents a straight line which connects the centers of the respective shot areas in the vertical direction. The angle defined by the α-axis and the X-axis of the stage coordinate system (X,Y) is the rotation θ. As shown in FIG. 4, a shot array on the wafer W based on linear approximation can be obtained by the EGA calculation, though nonlinear errors of the central points 22a to 22h with respect to the α-axis remain. For example, the central points 22c and 22b have large errors with respect to the α-axis.

In step 110, array error values $(\Delta G_{XN}, \Delta G_{YN})$ between the linear array coordinate values $(G_{Xn}, G_{Yn})$ calculated in step 109 and the actual measurement values $(XM_n, YM_n)$ are calculated. On the basis of the array error values $(\Delta G_{XN}, \Delta G_{YN})$, curvelinear interpolation is performed for the shot array on the wafer W by using the Lagrange's interpolation polynomial, thereby calculating nonlinear curvelinear array coordinate values. Assuming that the shot areas on the wafer W comprise p columns in the X direction and q rows in the Y direction, the curvelinear array coordinate values are calculated for the p columns and q rows, thereby obtaining the array coordinate values of all the shot areas on the wafer W. With this processing, curvelinear array coordinate values $(P_{Xms}, P_{Yms})$ are obtained for the p columns, and curvelinear array coordinate values $(Q_{Xms}, Q_{Yms})$ are obtained for the q rows. Note that m is an integer of 1 to p, and s is an integer of 1 to q. In this embodiment, the Lagrange's interpolation polynomial is used to calculate the curvelinear arrays of the shot areas. However, another interpolation or approximate expression may be used. For example, the coordinates may be approximated by a quadratic or cubic function.

Figure 5:
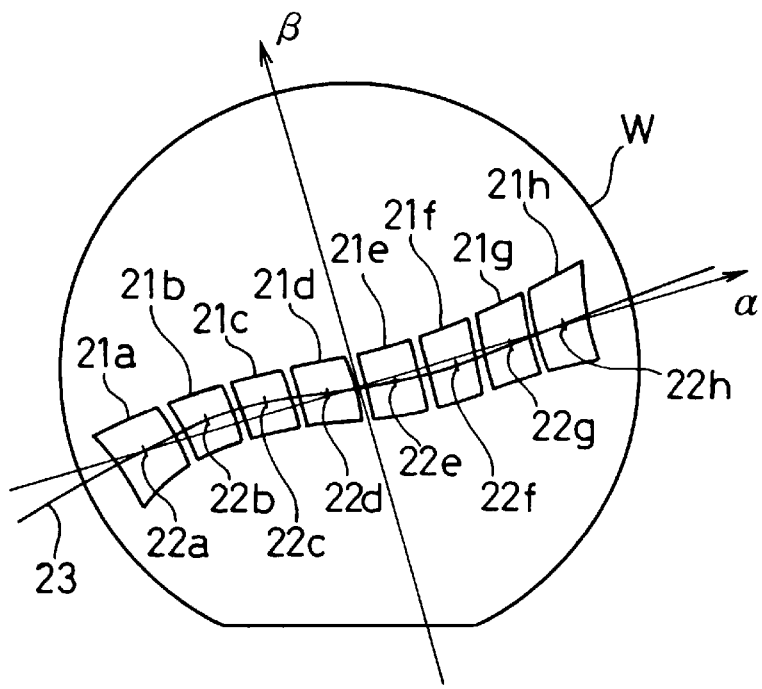
FIG. 5 is a plan view showing an array curve which takes the nonlinear component of the shot array shown in FIG. 3 into consideration.

FIG. 5 shows some curvelinear array coordinate values obtained by curvelinear approximation. In FIG. 5, an array curve 23 represents an approximate curve associated with the central points 22a to 22h of the shot areas 21a to 21h, and the curvelinear array coordinate values obtained by the above method represent an array close to the actual measurement values, as indicated by the array curve 23. In step 111, the contour curves of each shot area are calculated using an interpolation expression on the basis of the curvelinear array coordinate values obtained in step 110. When the contour curves of the shot areas 21a to 21h are to be obtained, assuming that the shot areas 21a to 21h are at row s, interpolation coordinate values ($TH_{Xms}$, $TH_{Yms}$) representing the contour of the end portion of the shot areas 21a to 21h in the +β direction are calculated by substituting ($P_{Ym(s-1)}$+$P_{Yms}$)/2 into an interpolation expression representing the p columns to which the shot areas 21a to 21h belong. Interpolation coordinate values ($BH_{Xms}$, $BH_{Yms}$) representing the contour of the end portion in the −β direction are calculated by substituting ($P_{Ym(s+1)}$+$P_{Yms}$)/2. In a similar manner, contour coordinate values ($RH_{Xms}$, $RH_{Yms}$) and ($LH_{Xms}$, $LH_{Yms}$) representing the left and right contours of the shot areas 21a to 21h along the α-axis are calculated. Contour coordinate values representing the contours of all the shot areas on the wafer W are calculated and stored in the central control system 13. The resultant contour coordinate values represent not the positions of the sides of the shot areas but the middle positions between adjacent shot areas, i.e., the positions of the central portions of the street lines. Therefore, if the positional coordinates of the sides of the shot areas are necessary, and the width of the street line is represented by d, the necessary coordinate values can be calculated by adding ±d/2 to the above interpolation coordinate values. The contour curves of each shot area along the β-axis are calculated in a similar manner.

FIG. 6 shows a curve map representing the interpolation coordinate values obtained by the above method. In FIG. 6, an interpolation curve 24T indicated by a broken line is a curve representing the interpolation coordinate values ($TH_{Xms}$, $TH_{Yms}$) representing the contour of the end portion of the shot areas 21a to 21h in the +β direction. An interpolation curve 24B indicated by a broken line is a curve representing the interpolation coordinate values ($BH_{Xms}$, $BH_{Yms}$) representing the contour of the end portion of the shot areas 21a to 21h in the −β direction. An interpolation curve 24R indicated by a broken line is a curve representing the interpolation coordinate values ($RH_{Xms}$, $RH_{Yms}$) representing the contour of the end portion of the shot area 21g in the −α direction. An interpolation curve 24L is a curve representing the interpolation coordinate values ($LH_{Xms}$, $LH_{Yms}$) representing the contour of the end portion of the shot area 21g in the +α direction.

In step 112, n is initialized to 1, and exposure of the shot areas is started. In step 113, the wafer stage 7 is positioned in accordance with the curvelinear array coordinate values representing the positions of the central points of the respective shot areas, which are obtained in step 110. In step 114, exposure is performed while scanning the wafer stage 7 or the reticle stage 3 from the stage position determined in step 113 along the interpolation curves between the shot areas, which are obtained in step 111. In this case, since the scanning direction of the wafer W is the β direction, e.g., the Z-stage 7Z shown in FIG. 2 is rotated to rotate the wafer W such that the β direction matches the Y-axis of the stage coordinate system.

Figure 7A:
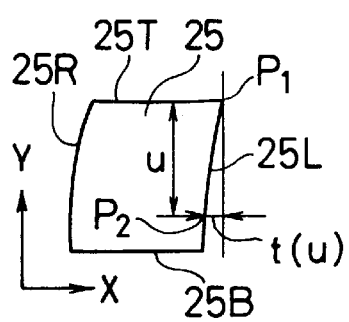
FIGS. 7A to 7F are views showing examples of correspondence between the distortion of each shot area shown in FIG. 6 and the scanning directions of the reticle stage and the wafer stage.
Figure 7B:
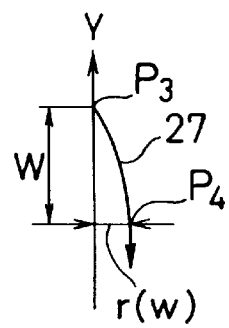
Figure 7C:
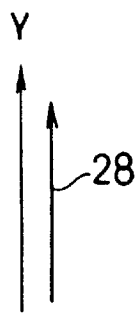
Figure 7D:
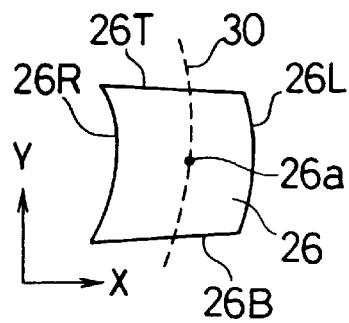
Figure 7E:
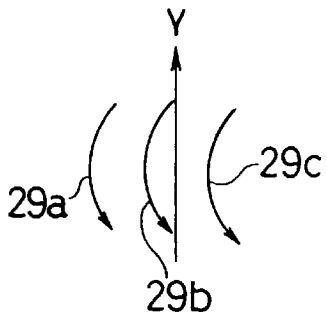
Figure 7F:
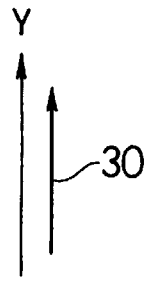

FIGS. 7A to 7F are views for explaining the scanning directions of the reticle stage 3 and the wafer stage 7 in correspondence with the contours of the shot areas. FIGS. 7A and 7D show two shot areas having different distortions. FIGS. 7B and 7E show the scanning directions of the reticle stage at that time. FIGS. 7C and 7F show the scanning directions of the wafer stage 7. As shown in FIG. 7A, when left and right sides 25R and 25L of a shot area 25 are uniformly bent in the +X direction (direction perpendicular to the β-axis) from a lower side 25B to an upper side 25T, the wafer stage 7 is scanned rectilinearly in the +Y direction (along the β-axis), and at the same time, the reticle stage 3 is scanned in the −Y direction such that the image of a scanning line 27 of the reticle stage 3, which is projected on the wafer W, has almost the same profile as that of the left and right sides 25R and 25L of the shot area 25, as shown in FIGS. 7C and 7B. If u represents the distance from an intersection $P_1$ of the upper side 25T and the right side 25L of the shot area 25 shown in FIG. 7A to a point $P_2$ of the right side 25L along the Y direction, and t(u) represents the distance from the intersection $P_1$ to the point $P_2$ along the X direction, the scanning method for the reticle stage 3 is controlled such that t(u)=βr(w) approximately holds where w and R(w) are the distances between a scanning start point $P_3$ of the reticle stage 3 shown in FIG. 7B and a point $P_4$ corresponding to the point P2 shown in FIG. 7A along the X and Y directions. Note that β represents the projection magnification of the projection optical system 5, and a relation u=βw holds between the distance u of the shot area and the scanning distance w of the reticle stage 3.

Assume that an upper side 26T and a lower side 26B of a shot area 26 are not parallel to each other, the width of a left side 26R is larger than that of a right side 26L, and the left and right sides are bent to bulge in the +X direction, as shown in FIG. 7D. In this case, as shown in FIG. 7E, scanning is performed such that left and right scanning directions of the reticle stage 3 are set along scanning curves 29a and 29c which respectively correspond to the two sides 26R and 26L of the shot area shown in FIG. 7D while the central portion of the reticle stage 3 is set along a scanning curve 29b corresponding to an array curve 30 representing curvelinear array coordinates which pass a central point 26a of the shot area 26 shown in FIG. 7D. More specifically, the reticle stage 3 is rotated counterclockwise, thereby adjusting the moving distance of the reticle stage 3 in the left or right direction.

Figure 8A:
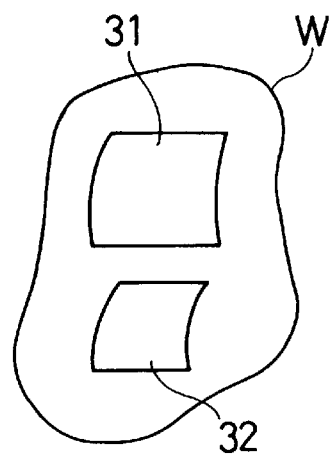
FIGS. 8A and 8B are views for explaining examples in which the distortion of each shot area shown in FIG. 6 is corrected by changing the level of the wafer stage.
Figure 8B:

When shot areas 31 and 32 have different sizes, as shown in FIG. 8A, or when, e.g., the upper and lower portions of a shot area 33 shown in FIG. 8B have largely different widths along the non-scanning direction, the processes shown in FIGS. 7A to 7F are executed while the telecentricity is disturbed, and additionally, the reticle stage 3 and the wafer stage 7 are moved in the Z direction perpendicular to the X-Y plane to change the projection magnification β. In the example shown in FIG. 8A, when the shot area 32 is to be exposed, the reticle stage 3 and the wafer stage 7 are moved in the Z direction to make the projection magnification β smaller than that for the shot area 31. In the example shown in FIG. 8B, when the shot area 33 is to be exposed, exposure is performed while the reticle stage 3 and the wafer stage 7 are moved in the Z direction during scanning to gradually decrease the projection magnification β.

In step 115, the value of the integer n is incremented by one. In step 116, it is confirmed whether all the shot areas have been exposed. If NO in step 116, the flow returns to step 113, and the next shot area is exposed. If YES in step 116, the exposed wafer W is removed (unloaded) from the wafer holder 6 in step 117, and exposure for the wafer W is ended.

According to the alignment method of this embodiment, an error caused by nonlinear distortion of a target process substrate, which cannot be corrected in the prior art, can be corrected, so that more accurate alignment can be performed. In addition, by scanning the wafer stage or reticle stage along a curve in the exposure operation in consideration of the distortion component of each shot area, the overlay accuracy can be improved not only at the central portion but also at the peripheral portion of the shot area, and the yield of chips available from one wafer can also be increased. Furthermore, according to this embodiment, when the contour curves of the shot areas on the wafer are calculated, the variations in magnification for the respective shot areas can be known, so that the magnification can be corrected in units of shot areas in the scanning/exposure operation.

The method of the present invention can be applied not only to a scan type projection exposure apparatus but also to a stepper type exposure apparatus which exposes the pattern on the reticle onto the shot areas on the wafer at once. The present invention is not limited to the above embodiment, and various changes and modifications can be made within the spirit and scope of the invention.

INDUSTRIAL APPLICABILITY

According to the alignment method of the present invention, since the nonlinear components of the array coordinates of a plurality of predetermined shot areas are obtained, the nonlinear distortion of a substrate (wafer), which cannot be detected in the prior art, can be detected. When the projected image of the pattern of the mask on the substrate is to be distorted in correspondence with the distortions of the shot areas, which are detected in the fourth process, alignment is performed in consideration of the nonlinear distortion of the substrate. Therefore, more accurate overlay is enabled.

When, in the fourth process, a plurality of curves which pass predetermined central points are to be approximated on the basis of the actual measurement array coordinates measured in the first process, and the contours of the shot areas on the substrate are to be calculated on the basis of the plurality of curves obtained by the approximation, contours roughly corresponding to the actual shapes of the shot areas can be obtained. When the accurate contours of the shot areas on the substrate are obtained, variations in magnification for the respective shot areas can be known. Therefore, the magnification can be corrected in units of shot areas, e.g., during exposure.

Assume that the exposure apparatus is a scan exposure type exposure apparatus which scans the mask relative to the substrate to sequentially transfer the pattern of the mask onto the respective shot areas on the substrate. When at least one of the relative scanning direction, the misalignment along the scanning direction, and the level of the substrate is to be changed during the relative scanning operation of the mask and substrate to distort the projected image of the pattern of the mask on the substrate, the relative scanning direction, the misalignment along the scanning direction, or the level of the substrate is changed in correspondence with the distortion of the shot area while scanning the shot area, thereby overlaying the projected image of the pattern on the substrate on the distorted shot area. Therefore, the overlay accuracy can be improved not only at the central portion but also at the peripheral portion of the shot area, and the yield of chips available from one wafer can also be increased.

I claim:

1. An alignment method for performing alignment between a shot area on a substrate and a pattern of a mask in an exposure apparatus which transfers said pattern formed on said mask onto said shot area on said substrate, characterized by comprising:

the first process of measuring array coordinates of predetermined reference points of a plurality of predetermined shot areas of all shot areas on said substrate, respectively;

the second process of performing statistical processing of actual measurement array coordinates measured in the first process and designed array coordinates of the predetermined reference points of said plurality of predetermined shot areas on said substrate, thereby calculating a linear component of the actual measurement array coordinates of the predetermined reference points;

the third process of subtracting the linear component from the actual measurement array coordinates to obtain a nonlinear component; and the fourth process of obtaining distortions of said shot areas on said substrate on the basis of the nonlinear component obtained in the third process.

2. An alignment method according to claim 1, characterized by comprising the process of distorting a projected image of said pattern of said mask on said substrate in correspondence with the distortions of said shot areas, which are detected in the fourth process.

3. An alignment method according to claim 2, characterized in that said exposure apparatus is a scan exposure type exposure apparatus which scans said mask relative to said substrate to sequentially transfer said pattern of said mask on each shot area on said substrate, and by comprising the process of changing at least one of a relative scanning direction, a misalignment along a scanning direction, and a level of said substrate during a relative scanning operation of said mask and said substrate to distort the projected image of said pattern of said mask on said substrate.

4. An alignment method for performing alignment between a shot area on a substrate and a pattern of a mask in an exposure apparatus which transfers said pattern formed on said mask onto said shot area on said substrate, said method comprising:

a first process of measuring array coordinates of predetermined reference points of a plurality of predetermined shot areas of all shot areas on said substrate, respectively;

a second process of performing statistical processing of actual measurement array coordinates measured in the first process and designed array coordinates of the predetermined reference points of said plurality of predetermined shot areas on said substrate, thereby calculating a linear component of the actual measurement array coordinates of the predetermined reference points;

a third process of subtracting the linear component from the actual measurement array coordinates to obtain a nonlinear component; and a fourth process of obtaining distortions of said shot areas on said substrate on the basis of the nonlinear component obtained in the third process, said fourth process comprising approximating a plurality of curves which pass the predetermined reference points on the basis of the actual measurement array coordinates which are measured in the first process, and obtaining contours of said shot areas on said substrate on the basis of the plurality of curves obtained by approximation.

5. An alignment method for performing alignment between a shot area on a substrate and a pattern of a mask in an exposure apparatus which transfers said pattern formed on said mask onto said shot area on said substrate, said method comprising:

a first process of measuring array coordinates of predetermined reference points of a plurality of predetermined shot areas of all shot areas on said substrate, respectively;

a second process of performing statistical processing of actual measurement array coordinates measured in the first process and designed array coordinates of the predetermined reference points of said plurality of predetermined shot areas on said substrate, thereby calculating a linear component of the actual measurement array coordinates of the predetermined reference points;

a third process of subtracting the linear component from the actual measurement array coordinates to obtain a nonlinear component;

a fourth process of obtaining distortions of said shot areas on said substrate on the basis of the nonlinear component obtained in the third process, said fourth process comprising approximating a plurality of curves which pass the predetermined reference points on the basis of the actual measurement array coordinates which are measured in the first process, and obtaining contours of said shot areas on said substrate on the basis of the plurality of curves obtained by approximation; and a fifth process of distorting a projected image of said pattern of said mask on said substrate in correspondence with the distortions of said shot areas, which are detected in the fourth process.

6. An exposure method of transferring a pattern formed on a mask onto each shot region of a substrate, said method comprising the steps of:

selecting a plurality of shot areas from said shot areas on said substrate;

measuring position data of said selected shot areas;

obtaining non-linear position errors of said selected shot areas based on said measured position data; and obtaining distortion in contour of each of said shot areas on said substrate based on said obtained non-linear position errors, thereby aligning said substrate for transfer of said pattern.

7. A method according to claim 6, wherein the step of obtaining non-linear position errors comprises the steps of:

calculating a linear array data of said selected shot areas on said substrate based an said measured position data; and calculating non-linear position errors of said selected shot areas based on said measured position data and said calculated linear array data.

8. A method according to claim 6, further comprising the step of transferring said pattern on said mask onto each shot area on said substrate and performing synchronous movement of said mask and said substrate.

9. A method according to claim 8, further comprising the step of rotating said mask during said synchronous movement based on said distortion in the contour of said each shot area.

10. A method according to claim 8, further comprising the step of varying projection magnification of an image of said pattern which is transferred on said substrate during said synchronous movement, based on said distortion on the contour of said each shot area.

11. An alignment method of aligning a substrate for transferring a pattern formed on a mask onto each shot region of said substrate, said method comprising the steps of:

selecting a plurality of shot areas from said shot areas on said substrate;

measuring position data of said selected shot areas;

obtaining non-linear position errors of said selected shot areas based on said measured position data; and obtaining curved array data of said shot areas on said substrate based on said obtained position error, thereby aligning said substrate based on said obtained curved array data.

12. A method according to claim 11, further comprising the step of obtaining a contour of said each shot area on said substrate.

13. An exposure method of transferring a pattern formed on a mask onto each shot region of a substrate, said method comprising the steps of:

obtaining curved array data of a plurality of shot areas on said substrate; and obtaining a distortion of said each shot area on said substrate based on said curved array data.

14. A method according to claim 13, wherein said array data obtaining step comprises the steps of:

selecting a plurality of shot areas from said shot areas on said substrate;

measuring position data of said selected shot areas;

obtaining curved array data of said plurality of shot areas based on said measured position data.

15. A method according to claim 13, further comprising the steps of:

obtaining a contour curve of said shot areas on said substrate based on said obtained curved array data; and obtaining a distortion of said each shot area on said substrate based on said contour curve.

16. A method according to claim 13 wherein said distortion data of said each shot area comprises a contour of said each shot area.

17. A method according to claim 13, further comprising the step of transferring said pattern on said mask onto each shot area on said substrate and performing synchronous movement of said mask and said substrate.

18. A method according to claim 17, further comprising the step of rotating said mask during said synchronous movement based on said distortion of said each shot area.

19. A method according to claim 17, further comprising the step of varying projection magnification of an image of said pattern which is transferred on said- substrate during said synchronous movement, based on said distortion of said each shot area.

20. An exposure method of transferring a pattern formed on a mask onto each shot region of a substrate, said method comprising the steps of:

obtaining non-linear array data of a plurality of shot areas on said substrate;

obtaining a distortion data of each shot area on said substrate based on said obtained array data:

obtaining a contour curve of said shot areas on said substrate based on said obtained non-linear array data; and obtaining a distortion of said each shot area on said substrate based on said contour curve.

21. An exposure method of transferring a pattern formed on a mask onto each shot region of a substrate, said method comprising the steps of:

obtaining non-linear array data of a plurality of shot areas on said substrate: and obtaining a distortion data of each shot area on said substrate based on said obtained array data, wherein said distortion data of said each shot area comprises a contour of said each shot area.

22. An exposure method of transferring a pattern formed on a mask onto each shot region of a substrate, said method comprising the steps of:

obtaining non-linear array data of a plurality of shot areas on said substrate;

obtaining a distortion data of each shot area on said substrate based on said obtained array data; and transferring said pattern on said mask onto each shot area on said substrate and performing synchronous movement of said mask and said substrate.

23. A method according to claim 22, further comprising the step of rotating said mask during said synchronous movement based on said distortion of said each shot area.

24. A method according to claim 22, further comprising the step of varying projection magnification of an image of said pattern which is transferred on said substrate during the said synchronous movement based on said distortion of said each shot area.

25. A scanning exposure method in which a pattern of a first object is transferred onto a second object through a projection system, the method comprising the steps of:

obtaining non-linear position data of shot areas on the second object; and adjusting exposure operation based on the obtained non-linear position data during scanning exposure.

26. A method according to claim 25, further comprising the steps of:

measuring position data of a part of the shot areas; and calculating a linear position data of said part of the shot areas based on the measured position data;

wherein the non-linear position data is obtained on the basis of the measured position data and the calculated linear position data.

27. A method according to claim 25, further comprising the step of:

obtaining distortion in contour of each of said shot areas based on the obtained non-linear position data;

wherein the adjusting step is performed on the basis of the obtained distortion in contour of each of said shot areas.

28. A method according to claim 25, wherein the adjusting step comprises the step of varying a pattern image projected on said second object.

29. A method according to claim 28, wherein the varying step comprises the step of varying projection magnification in said pattern image.

30. A method according to claim 28, wherein said varying step comprises the step of moving said first object in an optical axis of the projecting system.

31. A method according to claim 28, wherein said varying stop comprises the step of moving said second object in an optical axis of the projection system.

32. A method according to claim 25, wherein the adjusting step comprises the step of adjusting movement of said first and second objects.

33. A method according to claim 32, wherein the adjusting step comprises the step of adjusting a relative relationship between said first and second objects.

34. A method according to claim 25, wherein the adjusting step comprises the step of rotating said first object.

35. A scanning exposure apparatus in which a pattern of a first object is transferred onto a second object, the apparatus comprising:

a projection system, disposed between said first object and said second object, which projects a pattern image on one side thereof;

a scanning system, at least part of the scanning system being disposed on one side and on another side of the projection system, which moves said first object and said second object synchronously;

a detecting system which detects marks formed on said second object to obtain non-linear position data of shot areas on said second object; and a controller, functionally connected with the scanning system and the detecting system, which controls exposure operation based on the obtained non-linear position data during scanning exposure.

36. An apparatus according to claim 35, wherein said controller, during the scanning exposure, controls the scanning system to move said first object in an optical axis of the projection system.

37. An apparatus according to claim 35, wherein said controller, during the scanning exposure, controls the scanning system to move said second object in an optical axis of the projection system.

38. An apparatus according to claim 35, wherein said controller, during the scanning exposure, controls the scanning system to adjust the relative relationship between said first and second objects.

39. An apparatus according to claim 35, wherein said controller, during the scanning exposure, controls the scanning system to rotate said first object.

40. A method for making a scanning exposure apparatus in which a pattern of a first object is transferred onto a second object, the method comprising:

providing a projection system, disposed between said first object and said second object, which projects a pattern image on one side thereof;

providing a scanning system, at least part of the scanning system being disposed on one side and on another side of the projection system, which moves said first object and said second object synchronously;

providing a detecting system which detects marks formed on said second object to obtain non-linear position data of shot areas on said second object; and providing a controller, functionally connected with the scanning system and the detecting system, which controls exposure operation based on the obtained non-linear position data during scanning exposure.

41. A method according to claim 40, wherein said controller, during the scanning exposure, controls the scanning system to move said first object in an optical axis of the projection system.

42. A method according to claim 40, wherein said controller, during the scanning exposure, controls the scanning system to move said second object in an optical axis of the projection system.

43. A method according to claim 40, wherein said controller, during the scanning exposure, controls the scanning system to adjust the relative relationship between said first and second objects.

44. A method according to claim 40, wherein said controller, during the scanning exposure, controls the scanning system to rotate said first object.

* * * * *